United States Patent
Hosokawa et al.

(10) Patent No.: US 7,969,210 B2
(45) Date of Patent: Jun. 28, 2011

(54) ELECTRONIC CIRCUIT, FREQUENCY DIVIDER AND RADIO SET

(75) Inventors: Yoshifumi Hosokawa, Kanagawa (JP); Noriaki Saito, Tokyo (JP); Yoshito Shimizu, Kanagawa (JP)

(73) Assignee: Panasonic Corporation, Osaka (JP)

( * ) Notice: Subject to any disclaimer, the term of this patent is extended or adjusted under 35 U.S.C. 154(b) by 207 days.

(21) Appl. No.: 12/065,674

(22) PCT Filed: Sep. 1, 2006

(86) PCT No.: PCT/JP2006/317372
§ 371 (c)(1),
(2), (4) Date: Jul. 29, 2009

(87) PCT Pub. No.: WO2007/029624
PCT Pub. Date: Mar. 15, 2007

(65) Prior Publication Data
US 2009/0295436 A1    Dec. 3, 2009

(30) Foreign Application Priority Data

Sep. 5, 2005 (JP) ................. 2005-256781
Aug. 11, 2006 (JP) ................. 2006-220002

(51) Int. Cl.
*H03B 19/00* (2006.01)
(52) U.S. Cl. ........ 327/117; 327/115; 327/116; 327/118; 327/200; 327/201; 327/202; 327/203; 327/204

(58) Field of Classification Search .................. 327/115, 327/117, 200, 202
See application file for complete search history.

(56) References Cited

U.S. PATENT DOCUMENTS 6,496,083 B1 * 12/2002 Kushitani et al. ............. 333/103
7,298,183 B2 * 11/2007 Mirzaei et al. ................ 327/115

FOREIGN PATENT DOCUMENTS

| JP | 08-223030 | 8/1996 |
| JP | 11-55002 | 2/1999 |
| JP | 2003-124802 | 4/2003 |
| JP | 2004-153720 | 5/2004 |
| JP | 2005-184644 | 7/2005 |

OTHER PUBLICATIONS

International Search Report for PCT/JP2006/317372; Sep. 27, 2006.

* cited by examiner

*Primary Examiner* — Lincoln Donovan
*Assistant Examiner* — John W Poos
(74) *Attorney, Agent, or Firm* — Pearne & Gordon LLP

(57) ABSTRACT

A master stage 101 comprises a differential circuit composed of transistors 1 and 2, a differential circuit composed of transistors 3 and 4, a differential circuit composed of transistors 5 and 6, a load circuit 7 (a first load circuit), a load circuit 8 (a second load circuit), and a current source transistor 9. The load circuit 7 (the first load circuit) is composed of an inductor 7A (a first inductor), an inductor 7B (a fifth inductor), and a capacity 7C (a first capacity). The inductor 7B and capacity 7C cooperates together in forming a parallel resonance circuit (a first LC parallel resonance circuit), while the parallel resonance circuit is connected in series to the inductor 7A.

9 Claims, 9 Drawing Sheets

ELECTRONIC CIRCUIT, FREQUENCY DIVIDER AND RADIO SET

BACKGROUND OF THE INVENTION

1. Field of the Invention

The present invention relates to an electronic circuit and a frequency divider capable of varying and broadening a dividable input frequency band as well as a radio set capable of using two or more radio communication systems by using such electronic circuit and frequency divider.

2. Description of the Related Art

Conventionally, as a frequency divider capable of varying a dividable input frequency band, there is known a frequency divider which is disclosed in the patent reference 1. FIG. 9 is a circuit diagram of a conventional frequency divider disclosed in the patent reference 1.

In FIG. 9, a frequency divider 700 is a half frequency divider which divides an input signal into a signal of a half frequency and outputs the half-frequency signal therefrom. The frequency divider 700 is a master-slave mode D flip flop in which multiplier circuits are connected in two stages.

A master stage 701 comprises: a differential circuit composed of transistors Q1 and Q2; a differential circuit composed of transistors Q3 and Q4; a differential circuit composed of transistors Q9 and Q10; a current source transistor Q13; a load circuit composed of load resistors R1A, R1B and transistor switches Q1A, Q1B; and, a load circuit composed of load resistors R2A, R2B and transistor switches Q2A, Q2B.

A slave stage 702 comprises: a differential circuit composed of transistors Q5 and Q6; a differential circuit composed of transistors Q7 and Q8; a differential circuit composed of transistors Q11 and Q12; a current source transistor Q14; a load circuit composed of load resistors R3A, R3B and transistor switches Q3A, Q3B; and, a load circuit composed of load resistors R4A, R4B and transistor switches Q4A, Q4B.

An input terminal IN is connected to the respective bases of the transistors Q9 and Q12. An input terminal INB is connected to the respective bases of the transistors Q10 and Q11. The output of the master stage 701 is input to the respective bases of the transistors Q5 and Q6 of the slave stage 702.

The output of the slave stage 702 is input not only to the respective bases of transistors Q15 and Q16 but also to the respective bases of the transistors Q1 and Q2 of the master stage 701. An input signal is input to the input terminals IN and INB in the form of a differential signal. The output of the flip flop is obtained from the respective emitters of the transistors Q15 and Q16.

The bases of the current source transistors Q13 and Q14 are respectively connected to a programmable band gap regulator 711. The programmable band gap regulator 711 is able to vary an output potential VREG selectively. This can in turn vary the base potentials of the current source transistors Q13 and Q14, thereby being able to selectively vary a current IBIAS flowing in the master and slave stages.

The transistor switches Q1A, Q2A, Q3A and Q4A are respectively connected to a resistance select signal terminal VA. Also, the transistor switches Q1B, Q2B, Q3B and Q4B are respectively connected to a resistance select signal terminal VB.

According to signals which are input to the resistance select signal terminals VA and VB, the load of the present frequency diver can be switched to the load resistors R1A~R4A or load resistors R1B~R4B. When a potential to be applied to the resistance select signal terminal VA is a potential Vcc and a potential to be applied to the resistance select signal terminal VB is 0V, the transistor switches Q1A~Q4A are respectively turned on and the transistor switches Q1B~Q4B are respectively turned off. And, as regards the load of the frequency divider, there is obtained a state in which the load resistors R1A~R4A are selected.

Also, when a potential to be applied to the resistance select signal terminal VA is 0V and a potential to be applied to the resistance select signal terminal VB is the potential Vcc, the transistor switches Q1A~Q4A are respectively turned off and the transistor switches Q1B~Q4B are respectively turned on. And, for the load, there is obtained a state in which the load resistors R1B~R4B are selected. This makes it possible to vary the operation amplitude of the frequency divider selectively.

Based on the foregoing description, the patent reference 1 insists that, due to provision of the structure capable of varying two or more bias currents or the structure capable of varying two or more operation amplitudes, even when using the same chip and same power voltage, the frequency divider is able to vary a dividable frequency band greatly without saturating the circuits thereof.

Patent Reference 1: Specification (Page 3-4, FIG. 1) of Japanese Patent No. 2973858

DISCLOSURE OF THE INVENTION

Problems that the Invention is to Solve

However, in the conventional structure disclosed in the above-mentioned patent reference 1, to vary the dividable frequency band, there is necessary the control to switch the load resistors over to each other according to bias currents applied. For this reason, in order for the frequency divider to carry out its frequency dividing operation successively in a wide frequency band, it is necessary to prepare a large number of load resistors and switch them over to each other. And, it is also found that, as the input frequency of the frequency divider increases, the current consumption thereof increases.

Also, conventionally, an inductor used on an integrated circuit provides a large production error, so that, when an LC resonator is formed using such inductor, resonance cannot be obtained at the frequency that has been deigned.

The present invention aims at solving the problems found in the above-mentioned conventional structure. Thus, it is an object of the invention to provide not only an electronic circuit and a frequency divider which can vary and broaden a dividable frequency band without carrying out the control for varying the load resistors, but also a radio set using such electronic circuit and frequency divider.

Also, it is another object of the invention to provide not only en electronic circuit and a frequency divider which can widen the allowable range of the production error of the inductor and reduce the value of the inductor to thereby be able to reduce the occupation area thereof on an integrated circuit.

An electronic circuit according to the invention is an electronic circuit to be connected to a master-slave mode D flip flop which constitutes a frequency divider. The present electronic circuit comprises first and second circuit elements connected in series to each other, in which the first circuit element has a free run frequency which, when the electronic circuit is used as the load circuit of the above-mentioned D flip flop, functions as a first free run frequency, and a second element has a free run frequency which, when the electronic circuit is used as the load circuit of the above-mentioned D flip flop, functions as a second free run frequency different from the first free run frequency.

According to the above structure, by setting the first and second free run frequencies in a desired frequency band, a frequency divider, to which an electronic circuit according to the invention is connected as a load circuit, has two more free run frequencies such as the first and second free run frequencies, and thus is able to broaden a dividable frequency band without requiring control for varying the load circuit. Also, because the control for varying the load circuit is not required, the circuit scale of the frequency divider can be reduced as well as the circuit configurations thereof can be simplified.

Also, an electronic circuit according to the invention has the following structure. That is, the above-mentioned first circuit element is composed of inductors and the second circuit element is composed of LC parallel resonance circuits; and, the electronic circuit comprises a master stage and a slave stage. Specifically, the master stage includes: a first load circuit composed of a first inductor and a first LC parallel resonance circuit connected in series to each other; and a second load circuit composed of a second inductor and a second LC parallel resonance circuit connected in series to each other. And, the slave stage includes: a third load circuit composed of a third inductor and a third LC parallel resonance circuit connected in series to each other; and, a fourth load circuit composed of a fourth inductor and a fourth LC parallel resonance circuit connected in series to each other.

According to the above structure, since each of the load circuits of the master-slave mode D flip flop load circuit is composed of the inductor and LC parallel resonance circuit connected together in series, a frequency divider, to which an electronic circuit according to the invention is connected as a load circuit, can have two or more free run frequencies including free run frequencies provided by the inductors and free run frequencies provided by the LC parallel resonance circuits; and, dividable frequency bands including the respective free run frequencies are respectively broadened at a low Q factor, and such dividable frequency bands are overlapped on each other. Therefore, the present frequency divider is able to broaden the dividable frequency bands with no need for control for varying the load circuits. Also, because each load circuit is composed of the inductor and LC parallel resonance circuit and is thereby prevented against saturation, the present frequency divider is also able to control a current in a dividable frequency band in a wider range. Further, since there is eliminated the need for the control for varying the load circuit, not only the scale of the circuit can be reduced and thus the circuit can be simplified, but also the noise characteristic of the frequency divider can be improved. In this case, to obtain a wide band characteristic, it is not necessary to sharpen the resonance characteristic of the resonance circuit but the Q factor of the inductor may be set low. Also, since it is not necessary to sharpen the resonance characteristic of the resonance circuit, even when there exists a production error in the L value of the inductor, the wide band characteristic can be prevented from being deteriorated.

Also, an electronic circuit according to the invention includes: a first capacity which uses in common the capacity of the first LC parallel resonance circuit and the capacity of the second LC parallel resonance circuit by virtual grounding; and, a second capacity which uses in common the capacity of the third LC parallel resonance circuit and the capacity of the fourth LC parallel resonance circuit by virtual grounding.

According to the above structure, a frequency divider, to which an electronic circuit according to the invention is connected as a load circuit, not only can broaden a dividable frequency band with no need for the control for varying the load circuit, but also, by using the capacities each using two LC parallel resonance circuits by virtual grounding, can reduce the scale of the circuits thereof to simplify the circuits and thus can improve the noise characteristic of the frequency divider.

Also, according to the electronic circuit of to the invention, the inductor of the first LC parallel resonance circuit and the inductor of the second LC parallel resonance circuit cooperate together in constituting a transformer, while the inductor of the third LC parallel resonance circuit and the inductor of the fourth LC parallel resonance circuit cooperate together in constituting a transformer.

According to the above structure, a frequency divider, to which an electronic circuit according to the invention is connected as a load circuit, not only can broaden the dividable frequency band with no need for the control for varying the load circuits but also can reduce the scale of the circuit to thereby improve the noise characteristic of the frequency divider. Also, since the L values can be reduced by constituting the transformers, the occupation area of the frequency divider on an integrated circuit can be reduced.

Also, according to the electronic circuit of the invention, the first inductor and the inductor of the first LC parallel resonance circuit cooperate together in constituting a transformer, the second inductor and the inductor of the second LC parallel resonance circuit cooperate together in constituting a transformer, the third inductor and the inductor of the third LC parallel resonance circuit cooperate together in constituting a transformer, and the fourth inductor and the inductor of the fourth LC parallel resonance circuit cooperate together in constituting a transformer.

According to the above structure, a frequency divider, to which an electronic circuit according to the invention is connected as a load circuit, not only can broaden a dividable frequency band with no need for the control for varying the load circuits but also can reduce the scale of the circuits further to thereby be able to improve the noise characteristic of the frequency divider.

Also, according to the electronic circuit of the invention, first spiral inductors respectively constitute the first inductor and the inductor of the first LC parallel resonance circuit, second spiral inductors respectively constitute the second inductor and the inductor of the second LC parallel resonance circuit, the first capacity connects the first and second spiral inductors to each other, third spiral inductors respectively constitute the third inductor and the inductor of the third LC parallel resonance circuit, fourth spiral inductors respectively constitute the fourth inductor and the inductor of the fourth LC resonance circuit, and the second capacity connects the third and fourth spiral inductors to each other.

According to the above structure, a frequency divider, to which an electronic circuit according to the invention is connected as a load circuit, not only can broaden a dividable frequency band with no need for the control for varying a load circuit but also can reduce the scale of the circuit further to thereby be able to improve the noise characteristic of the frequency divider.

Also, according to the electronic circuit of the invention, the first free run frequency is higher than the second free run frequency.

According to the above structure, a frequency divider, to which an electronic circuit according to the invention is connected as a load circuit, can broaden a dividable frequency band with no need for the control for varying the load circuits.

Also, a frequency divider according to the invention includes an electronic circuit according to the invention.

According to the above structure, the present frequency divider can broaden a dividable frequency band with no need for the control for varying the load circuits and thus can be effectively used as a multi-band frequency divider.

And, a frequency divider according to the invention includes a control part for varying the bias current of the master-slave mode flip flop.

According to the above structure, by varying the bias current of the master-slave mode flip flop, the frequency characteristics of the transistors can be varied, whereby a dividable frequency band can be broadened with no need for the control for varying the load circuits.

Also, a radio set according to the invention incorporates therein a frequency divider according to the invention.

According to the above structure, by dividing the output of a voltage control oscillator to a wide frequency band, the radio part of the radio set can be simplified as well as can be reduced in size and cost. Also, since the noise characteristic of the radio set can be improved, the receiving characteristic of the radio set can be improved.

According to the invention, a dividable frequency band can be varied and broadened with no need for the control for varying the load circuits. Also, because of no control for varying the load circuits, not only the electronic circuit can be reduced in size and thus the electronic circuit can be simplified but also the noise characteristic of the electronic circuit can be improved.

DESCRIPTION OF REFERENCE CHARACTERS AND SIGNS

Figure 1:
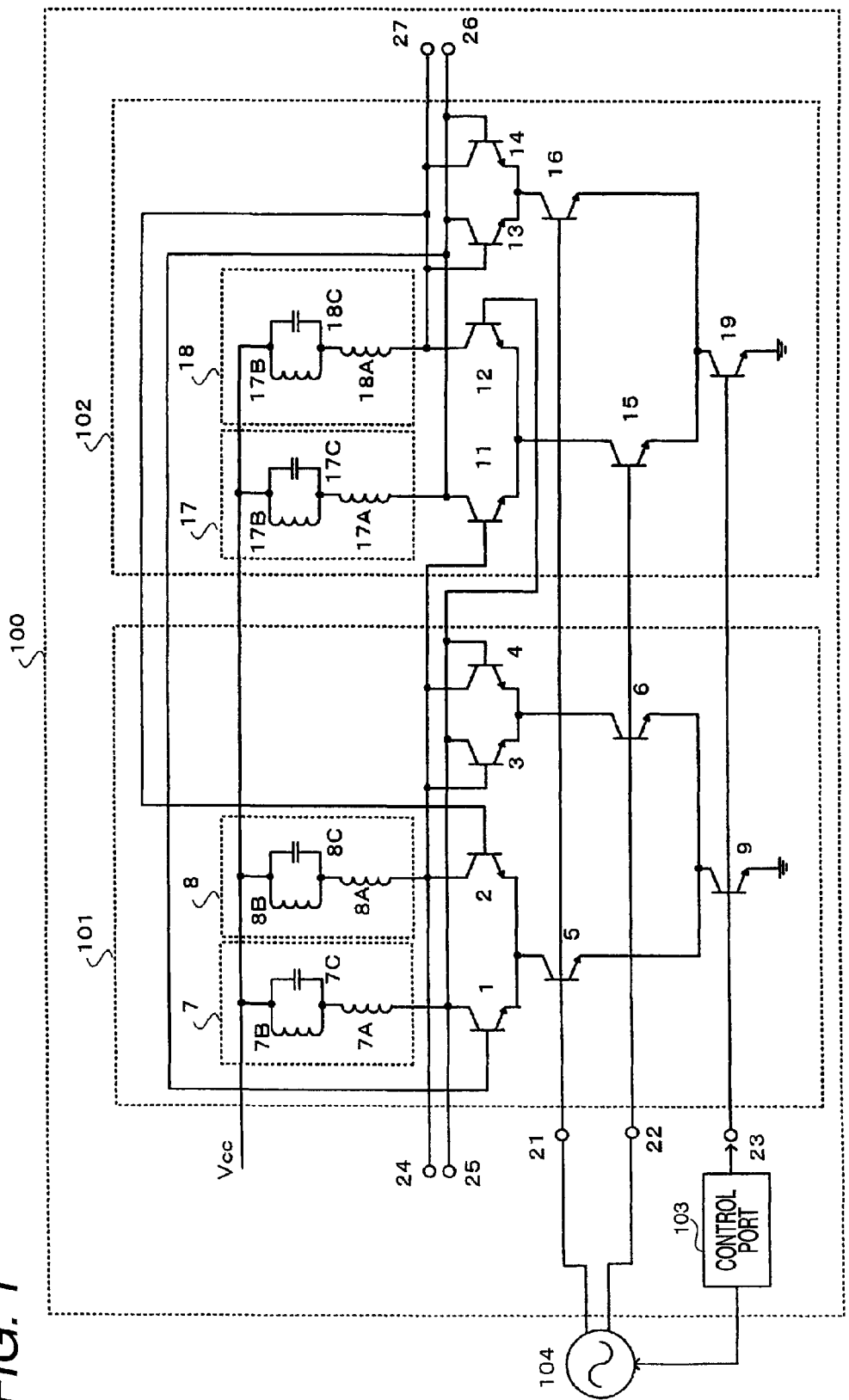
FIG. 1 is a circuit diagram of a multi-band frequency divider according to an embodiment 1 of the invention.

1, 2, 3, 4, 5, 11, 12, 13, 14, 15, 16: Transistor
7, 8, 17, 18, 31, 32, 33, 34, 35, 36, 37, 38: Load circuit
9, 19: Current source transistor
21, 22: Input terminal
23: Bias terminal
24: I output terminal
25: IB output terminal
26: Q output terminal
27: QB output terminal
100, 200, 300, 400, 500, 610, 700: Multi-band frequency divider
101, 201, 301, 401, 501, 701: Master stage
102, 202, 302, 402, 502, 702: Slave stage
103: Control part
104: Oscillator
600: Multi-band radio set
601: Antenna
602: Switch
603: Receive part
604: Transmit part
605: Low noise amplifier
606: Demodulator
607: Power amplifier
608: Modulator
609: Oscillator
611: Signal Process part
711: Programmable band gap regulator
Q1, Q2, Q3, Q4, Q5, Q6, Q7, Q8, Q9, Q10, Q11, Q12: Transistor
Q1A, Q1B, Q2A, Q2B: Transistor switch
Q13, Q14: Current source transistor
R1A, R1B, R2A, R2B, R3A, R3B, R4A, R4B: Load resistor

BEST MODE FOR CARRYING OUT THE INVENTION

Now, description will be given below of embodiments according to the invention with reference to the accompanying drawings.

Embodiment 1

In the present embodiment 1, description will be given below of a multi-band frequency divider which can vary and broaden a dividable frequency band with no need for control for switching the load of the frequency divider.

FIG. 1 is a circuit diagram of a multi-band frequency divider according to the embodiment 1 of the invention. In FIG. 1, the multi-band frequency divider 100 is a half frequency divider which divides a signal input therein into a signal of a half frequency and then outputs the resultant signal therefrom. The frequency divider 100 is composed of a master-slave mode D flip flop including multiplier circuits connected together in two stages.

A master stage 101 comprises a differential circuit composed of transistors 1 and 2, a differential circuit composed of transistors 3 and 4, a differential circuit composed of transistors 5 and 6, a load circuit 7 (a first load circuit), a load circuit 8 (a second load circuit), and a current source transistor 9.

The emitters of the transistors 1 and 2 are respectively connected to the collector of the transistor 5. The emitters of the transistors 3 and 4 are respectively connected to the collector of the transistor 6. The emitters of the transistors 5 and 6 are respectively connected to the collector of the current source transistor 9.

The collectors of the transistors 1 and 3 are respectively connected not only to a power voltage Vcc through the load circuit 7 but also to the base of the transistor 4. The collectors of the transistors 2 and 4 are respectively connected not only to the power voltage Vcc through the load circuit 8 but also to the base of the transistor 3.

A slave stage 102 comprises a differential circuit composed of transistors 11 and 12, a differential circuit composed of transistors 13 and 14, a differential circuit composed of transistors 15 and 16, a load circuit 17 (a third load circuit), a load circuit 18 (a fourth load circuit), and a current source transistor 19.

The emitters of the transistors 11 and 12 are respectively connected to the collector of the transistor 15. The emitters of the transistors 13 and 14 are respectively connected to the collector of the transistor 16. The emitters of the transistors 15 and 16 are respectively connected to the collector of the current source transistor 19.

The collectors of the transistors 11 and 13 are respectively connected not only to the power voltage Vcc through the load circuit 17 but also to the base of the transistor 14. The collectors of the transistors 12 and 14 are respectively connected not only to the power voltage Vcc through the load circuit 18 but also to the base of the transistor 13.

An input terminal 21 is connected to the respective bases of the transistors 5 and 16. An input terminal 22 is connected to the respective bases of the transistors 6 and 15. A bias terminal 23 is connected to the respective bases of the current source transistors 9 and 19. The emitters of the current source transistors 9 and 19 are respectively connected the ground.

According to a potential to be applied to the bias terminal 23, the bias current of the multi-band frequency divider 100 can be controlled. A control part 103 applies a bias control signal to the bias terminal 23 and also applies an oscillation control signal to an oscillator 104.

The oscillator 104 inputs input signals each having a frequency according to the oscillation control signal to the input terminals 21 and 22 in the form of differential signals. The current source transistor 9 supplies a bias current, which corresponds to the bias control signal, to the master stage 101. The current source transistor 9 supplies a bias current, which corresponds to the bias control signal, to the slave stage 102.

An I output terminal 24 is connected to the respective collectors of the transistors 2 and 4. An IB output terminal 25 is connected to respective collectors of the transistors 1 and 3. A Q output terminal 26 is connected to the respective collectors of the transistors 11 and 13. A QB output terminal 27 is connected to respective collectors of the transistors 12 and 14.

Input signals are respectively input to the master stage 101 from the input terminals 21 and 22 in the form of differential signals. The output of the master stage 101 is output from the I output terminal and IB output terminal in the form of a differential signal, that is, as a differential I signal, as well as is input to the respective bases of the transistors 11 and 12 of the slave stage 102.

The output of the slave stage 102 is output from the Q output terminal 26 and QB output terminal 27 in the form of a differential signal, that is, as a differential Q signal, as well as is input to the respective bases of the transistors 1 and 2 of the master stage 101. The differential I signal and differential Q signal have a phase difference of 90° with respect to each other.

The load circuit (the first load circuit) is composed of an inductor 7A (a first inductor), an inductor 7B (a second inductor), and a capacity 7C (a first capacity). The inductor 7B and capacity 7C cooperate together in constituting a parallel resonance circuit (a first LC parallel resonance circuit), while the first LC parallel resonance circuit is connected in series to the inductor 7A.

The load circuits 8, 17 and 18 (the second, third and fourth load circuits) are similar in structure to the load circuit 7. The inductors 7A, 8A, 17A and 18A have the same L value. The inductors 7B, 8B, 17B and 18B also have the same L value. The capacities 7C, 8C, 17C and 18C have the same C value. Thanks to this, the multi-band frequency divider 100 have two or more free run frequencies, that is, a free run frequency provided by the inductors 7A, 8A, 17A and 18A, and a free run frequency provided by the parallel resonance circuits respectively composed of the inductors 7B, 8B, 17B and 18B and their associated capacities 7C, 7B, 17C and 18C; and, therefore, the multi-band frequency divider 100 is able to broaden a dividable frequency band.

Figure 2:
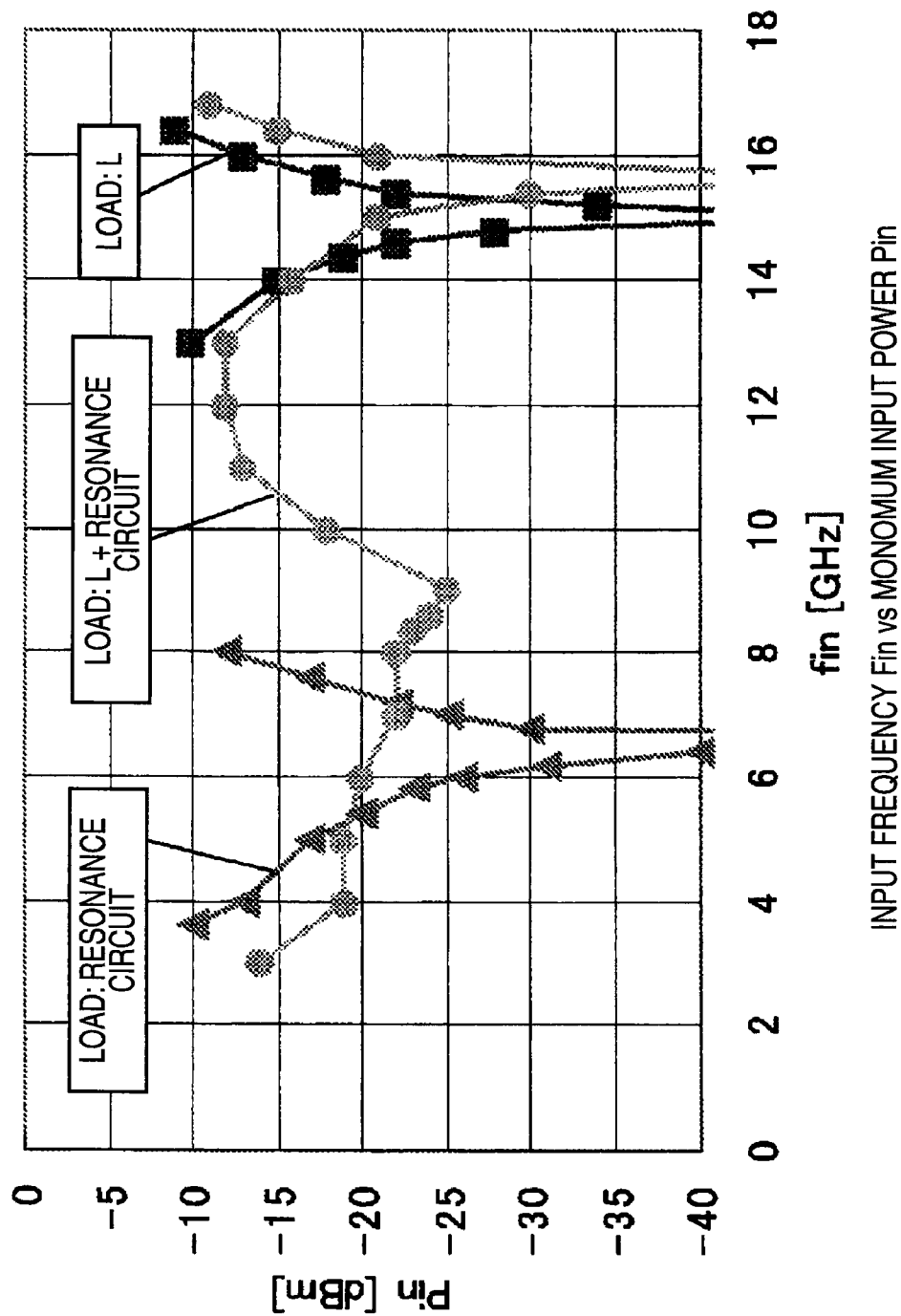
FIG. 2 is a characteristic view of a multi-band frequency divider according to an embodiment 1 of the invention, showing the analysis results thereof.

Now, FIG. 2 is a graphical representation of the analysis results of the minimum input power necessary for frequency division with respect to an input frequency. In FIG. 2, the analysis result of the present embodiment 1 is shown by a graph "load: L+resonance circuit". Also, the analysis result, in a case where the load circuit is composed of only inductors, is shown by a graph "load: L". In this case, the L value of the inductors is equal to that of the inductors 7A, 8A, 17A and 18A.

The analysis result, in a case where the load circuit is composed of only parallel resonance circuits, is shown by a graph "load: resonance circuit". In this case, the L value of the inductors of the parallel resonance circuits is equal to that of the inductors 7B, 8B, 17B and 18B and, at the same time, the C value of the capacities of the parallel resonance circuits is equal to that of the capacities 7C, 8C, 17C and 18C. In all graphs, the bias current is equal.

Generally, a frequency divider is able to divide frequencies in a frequency band the minimum input power (the minimum input power necessary for frequency division) of which is equal to or less than the power that is input from an oscillator. For example, it is assumed that the input power of a signal to be input to the multi-band frequency divider 100 from the oscillator 104 is of the order of −10 dBm. In this case, a frequency band (about 3 GHz~17 GHz), which corresponds to the minimum input power necessary for frequency division of −10 dBm or less, provides the dividable frequency band that the multi-band frequency divider 100 is able to divide.

The multi-band frequency divider 100 according to the present embodiment 1 has the same free run frequencies as a frequency divider in which load circuits are respectively composed of only the inductors. Also, even in the vicinity of the free run frequency of the frequency divider the load circuits of which are respectively composed of only the parallel resonance circuits, the minimum input power necessary for frequency division in the multi-band frequency divider 100 is equal to or less than −10 dBm; and thus, it is obvious that the multi-band frequency divider 100 is able to divide the frequency of a signal even in the vicinity of such free run frequency. Therefore, the multi-band frequency divider 100 is able to divide the frequency of a signal in two frequency bands, that is, a frequency band in which a frequency divider having load circuits respectively composed of only inductors can divide the frequency of a signal, and a frequency band in which a frequency divider having load circuits respectively composed of only parallel resonance circuits can divide the frequency of a signal. Also, according to the analysis results shown in FIG. 2, the multi-band frequency divider 100 is also able to divide frequencies existing in a frequency band between a free run frequency provided by a frequency divider having load circuits respectively composed of only inductors and a free run frequency provided by a frequency divider having load circuits respectively composed of only parallel resonance circuits.

Accordingly, when the free run frequency of a frequency divider having load circuits respectively composed of only the inductors and the free run frequency of a frequency divider having load circuits respectively composed of only the parallel resonance circuits are designed such that they belong to different frequency bands, the dividable frequency band of the multi-band frequency divider 100 can be broadened.

Also, preferably, the free run frequency of a frequency divider having load circuits respectively composed of only the inductors 7A, 8A, 17A and 18B may be set higher than the free run frequency of a frequency divider having load circuits respectively composed of only the parallel resonance circuits that are respectively made of the inductors 7B, 8B, 17B and 18B and capacities 7C, 8C, 17C and 18C.

And, when, in a frequency band ranging between the free run frequency of a frequency divider having load circuits respectively composed of only inductors and the free run frequency of a frequency divider having load circuits respectively composed of only parallel resonance circuits, the minimum input power necessary for frequency division is designed such that it does not exceed the input power of the oscillator 104, the frequency dividing operation can be executed successively in a wide frequency band.

Also, although FIG. 2 shows the analysis results obtained when the bias current is set constant, by varying the bias current according to the bias control signal of the control part 103, the dividable frequency band can be varied. In this case, since the load circuit provides no voltage drop, there is no possibility that the electronic circuit can be saturated. Also, the noise characteristic of the multi-band frequency divider 100 can also be improved.

And, since an electronic circuit according to the present embodiment is able to obtain a wide band characteristic with no need to sharpen the resonance characteristics of the resonance circuits, the Q factor of the inductors may be set low. Thanks to this, because the resonance characteristic of the resonance circuit is not sharp, even when there is a production error in the L value of the inductors, the wide band characteristic of the present electronic circuit cannot be impaired. Preferably, the Q factor of the inductors and capacities used in the load circuits of a multi-band frequency divider may be set low, about 1~3.

From the foregoing description, according to the multi-band frequency divider of the present embodiment, a dividable frequency band can be broadened with no need for control for varying a load circuit. Elimination of the need for control for varying a load circuit can reduce the scale of the circuit and thus simplify the circuit. Also, the noise characteristic of the multi-band frequency divider can also be improved.

By the way, in the present embodiment, description has been given of a multi-band frequency divider using bipolar transistors. However, there may also be used FET. Also, in the present embodiment, although description has been given of a load circuit which is composed of inductors and a single parallel resonance circuit connected in series to each other, the load circuit may also use two or more parallel resonance circuits. This makes it possible to broaden a dividable frequency band more. And, in the present embodiment, description has been given of the multi-band frequency divider for dividing a signal into a signal of a half frequency, but there may also be employed a structure in which the number of frequencies divided is other than 2.

Embodiment 2

In the present embodiment 2, description will be given below of another structure of a multi-band frequency divider which can vary and broaden a dividable frequency band with no need for control for switching the load of the frequency divider.

Figure 3:
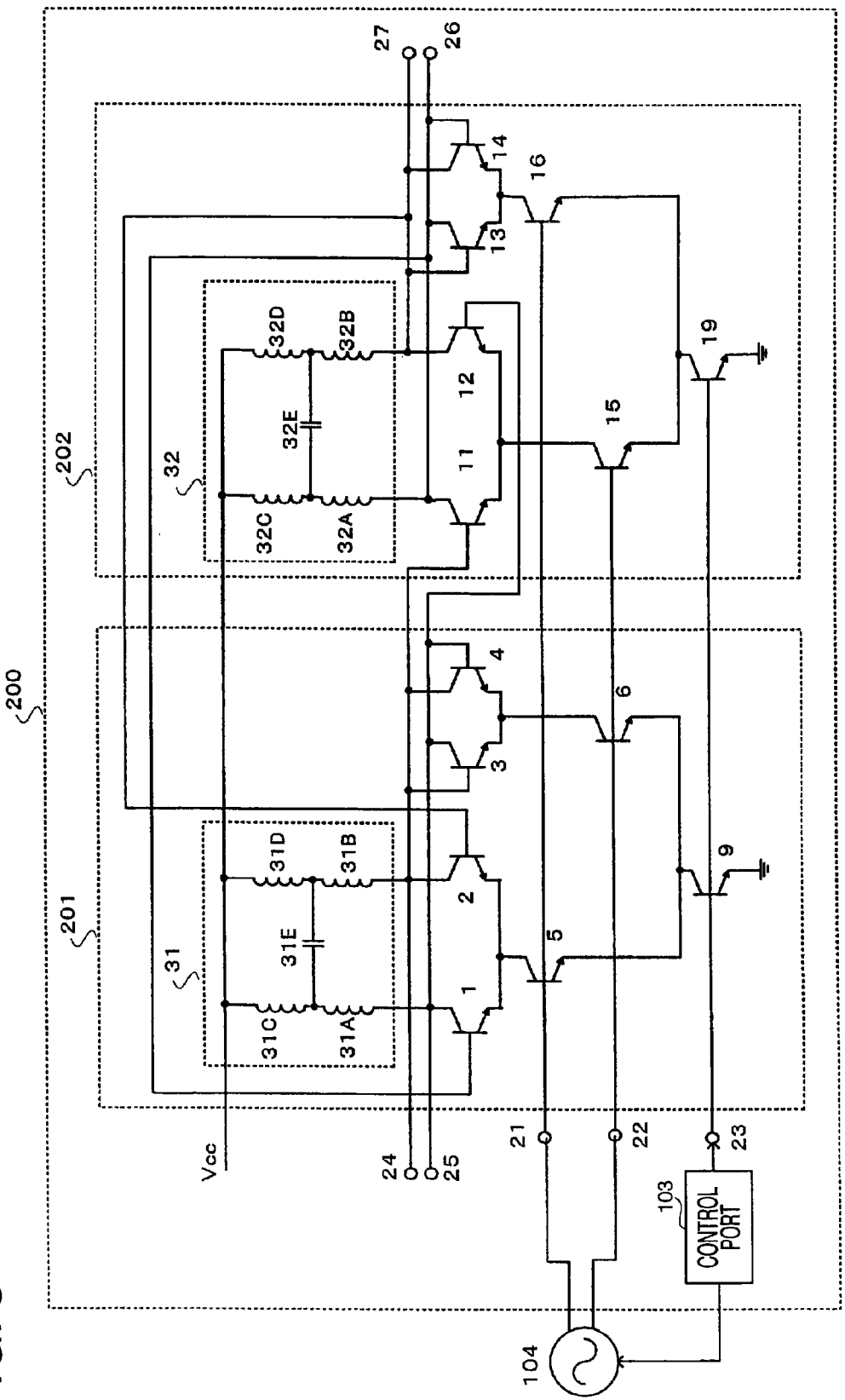
FIG. 3 is a circuit diagram of a multi-band frequency divider according to an embodiment 2 of the invention.

FIG. 3 is a circuit diagram of a multi-band frequency divider according to the embodiment 2 of the invention. In FIG. 3, the multi-band frequency divider 200 is a half frequency divider which divides a signal input therein into a signal of a half frequency and then outputs the resultant signal therefrom. In the embodiment 2, the same circuits as those described above in the embodiment 1 of the invention are given the same designations and the duplicate description thereof is omitted here. The embodiment 2 is different from the embodiment 1 in that it uses a load circuit 31 in a master stage 201 and a load circuit 32 in a slave stage 202.

The load circuit 31 is composed of an inductor 31A, an inductor 31B, an inductor 31C, an inductor 31D, and a capacity 31E (a fifth capacity). The inductors 31A and 31C are connected in series to each other. The respective collectors of transistors 1 and 3 are connected through the inductors 31A and inductor 31C to a power voltage Vcc.

The inductors 31B and 31D are connected in series to each other. The respective collectors of transistors 2 and 4 are connected through the inductors 31B and inductor 31D to the power voltage Vcc.

The capacity 31E is connected between the connecting point of the inductors 31A and 31C and the connecting point of the inductors 31B and 31D. The capacity 31E virtually grounds a portion interposed between the connecting point of the inductors 31A and 31C and the connecting point of the inductors 31B and 31D. Therefore, a resonance circuit composed of the inductor 31C and capacity 31E is connected in series to the inductor 31A. And, a resonance circuit composed of the inductor 31D and capacity 31E is connected in series to the inductor 31B.

Also, the load circuit 32 is similar in structure to the load circuit 31. The inductors 31A, 31B, 31C, and 31D have the same L value. The capacities 31E and 32E have the same C value.

Thanks to this structure, although one capacity is reduced from the load circuits employed in the embodiment 1 according to the invention, the embodiment 2 can provide an equivalent characteristic to the embodiment 1. Also, preferably, the inductors and capacities used in the load circuits of the multi-band frequency divider may have a low Q factor, that is, about 1~3.

From the foregoing description, according to the multi-band frequency divider of the present embodiment, a dividable frequency band can be broadened with no need for control for varying the load circuits. Elimination of the need for control for varying the load circuits can reduce the scale of the circuit and thus can simplify the circuit. Also, the noise characteristic of the multi-band frequency divider can be improved.

By the way, in the present embodiment, description has been given above of a multi-band frequency divider using bipolar transistors. However, there may also be used an FET. Also, in the present embodiment, description has been given above of a multi-band frequency divider for dividing a signal into a signal of a half frequency. However, there may also be employed a structure in which the divided number of the frequency of a signal is other than two.

Embodiment 3

In the present embodiment 3, description will be given below of still another structure of a multi-band frequency divider which can vary and broaden a dividable frequency band with no need for control for switching the load of the frequency divider.

Figure 4:
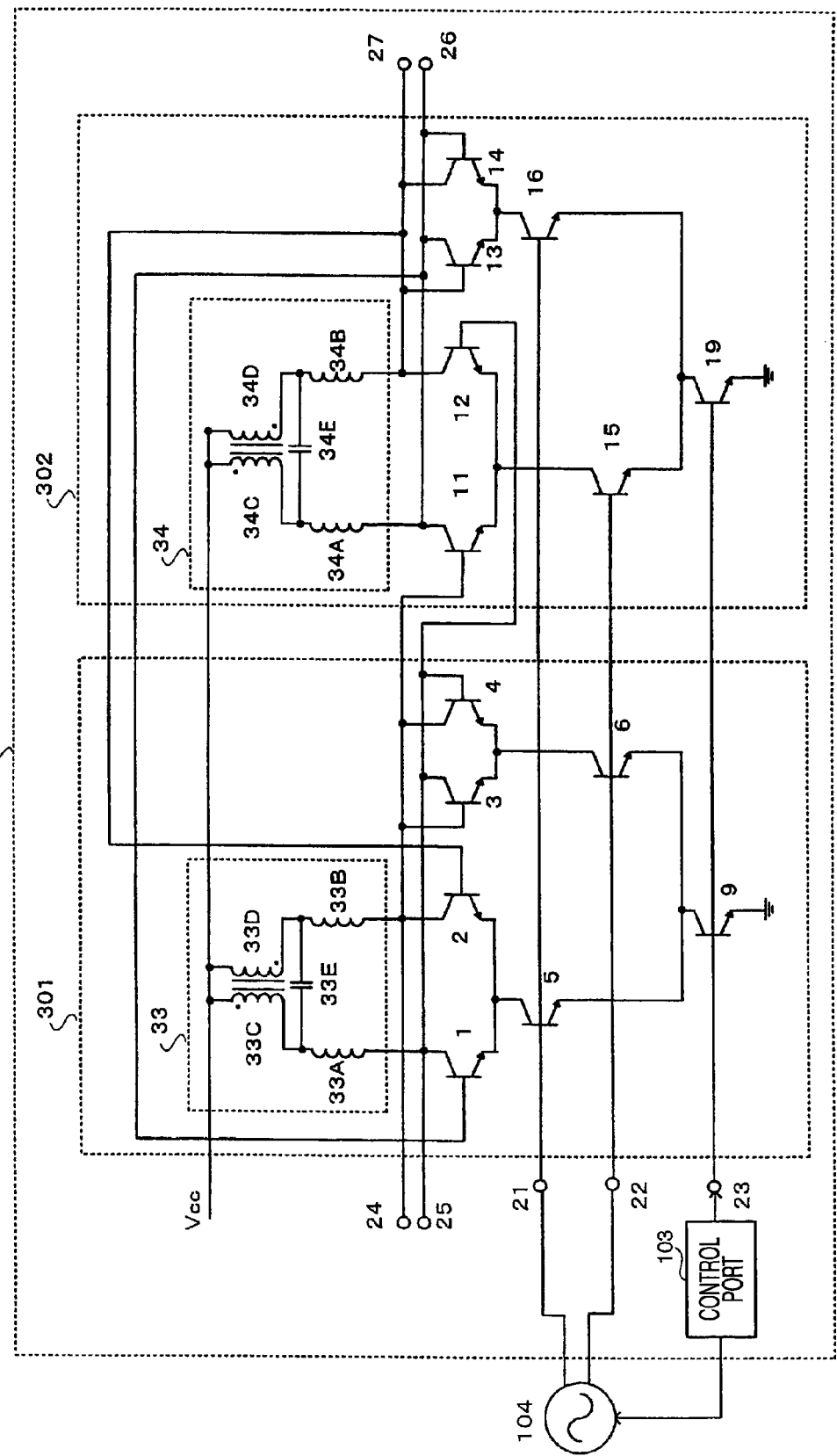
FIG. 4 is a circuit diagram of a multi-band frequency divider according to an embodiment 3 of the invention.

FIG. 4 is a circuit diagram of a multi-band frequency divider according to the embodiment 3 of the invention. In FIG. 4, the multi-band frequency divider 300 is a half frequency divider which divides a signal input therein into a signal of a half frequency and then outputs the resultant signal therefrom. In the embodiment 3, the same circuits as those described above in the embodiment 1 of the invention are given the same designations and the duplicate description thereof is omitted here. The embodiment 3 is different from the embodiment 1 in that it uses a load circuit 33 in a master stage 301 and a load circuit 34 in a slave stage 302.

The load circuit 33 is composed of an inductor 33A, an inductor 33B, an inductor 33C, an inductor 33D, and a capacity 33E. The inductors 33A and 33C are connected in series to each other. The respective collectors of transistors 1 and 3 are connected through the inductors 33A and 33C to a power voltage Vcc.

The inductors 33B and 33D are connected in series to each other. The respective collectors of transistors 2 and 4 are connected through the inductors 33B and inductor 33D to the power voltage Vcc.

The capacity 33E is connected between the connecting point of the inductors 33A and 33C and the connecting point of the inductors 33B and 33D. The inductors 33C and 33D cooperate together in constituting a transformer (a first transformer) the polarities of which are opposite to each other (in which the inductors 33C and 33D are differentially connected to each other).

Also, the load circuit 34 is similar in structure to the load circuit 33. The inductors 33A, 33B, 34A, and 34B have the same L value. The inductors 33C, 33D, 34C, and 34D have the same L value. The capacities 33E and 34E have the same C value.

Thanks to this structure, since one capacity can be reduced from the load circuits employed in the embodiment 1 according to the invention and the L values of the inductors constituting the transformer can be reduced, the embodiment 3 not only can reduce the occupation area of the circuits but also can provide an equivalent characteristic to the embodiment 1. Also, preferably, the inductors and capacities used in the load circuits of the multi-band frequency divider may have a low Q factor, that is, about 1~3.

From the foregoing description, according to the multi-band frequency divider of the present embodiment, a dividable frequency band can be broadened with no need for control for varying the load circuits. Elimination of the need for control for varying the load circuits can reduce the scale of the circuit and thus can simplify the circuit. Also, the noise characteristic of the multi-band frequency divider can be improved.

By the way, in the present embodiment, description has been given above of a multi-band frequency divider using bipolar transistors. However, there may also be used an FET. Also, in the present embodiment, description has been given above of a multi-band frequency divider for dividing a signal into a signal of a half frequency. However, it is also possible to employ another structure in which the divided number of the frequency of a signal is other than two.

Embodiment 4

In the present embodiment 4, description will be given below of a fourth structure of a multi-band frequency divider which can vary and broaden a dividable frequency band with no need for control for switching the load of the frequency divider.

Figure 5:
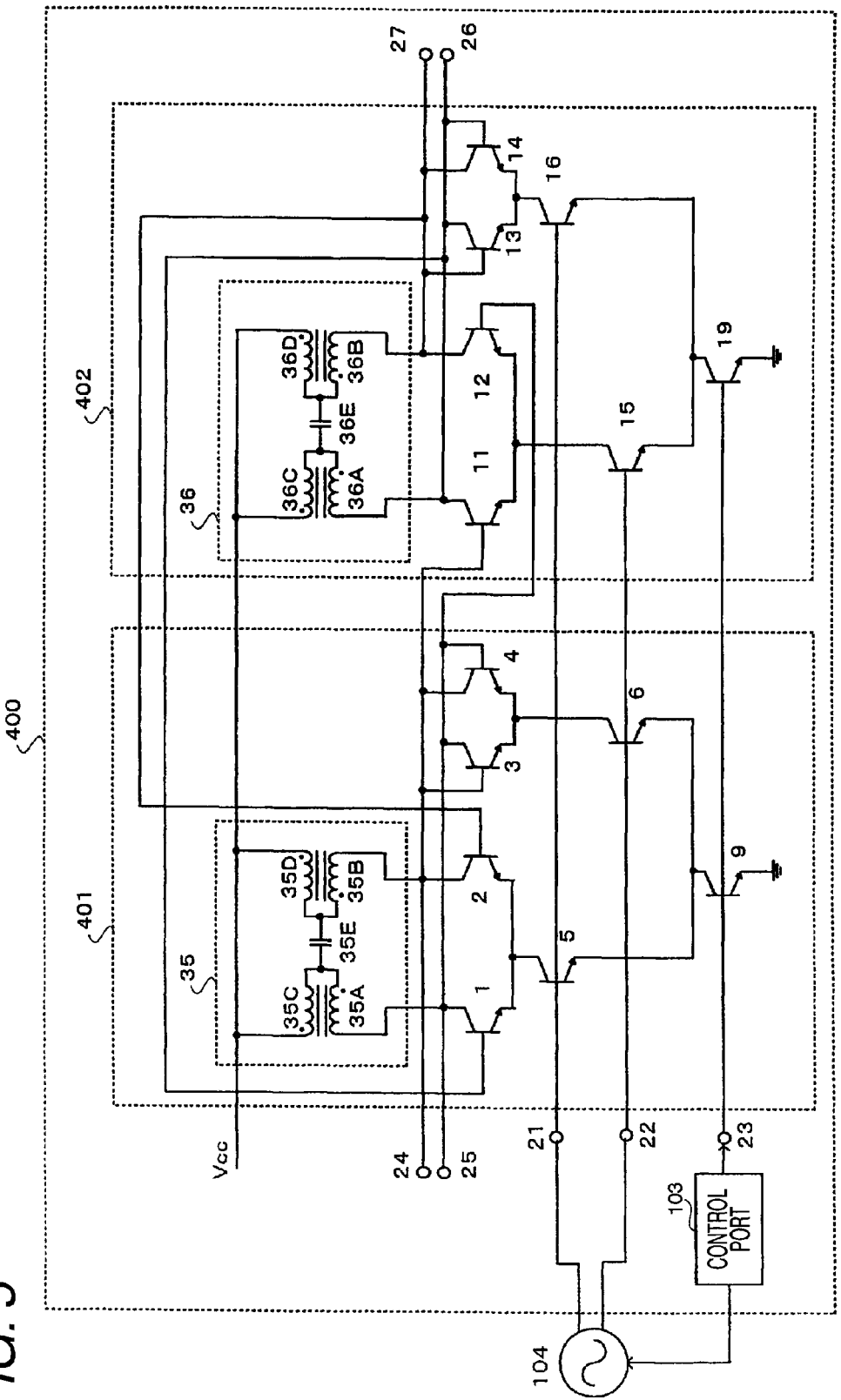
FIG. 5 is a circuit diagram of a multi-band frequency divider according to an embodiment 4 of the invention.

FIG. 5 is a circuit diagram of a multi-band frequency divider according to the embodiment 4 of the invention. In FIG. 5, the multi-band frequency divider 400 is a half frequency divider which divides a signal input therein into a signal of a half frequency and then outputs the resultant signal therefrom. In the embodiment 4, the same circuits as those described above in the embodiment 1 of the invention are given the same designations and the duplicate description thereof is omitted here. The embodiment 4 is different from the embodiment 1 in that it uses a load circuit 35 in a master stage 401 and a load circuit 36 in a slave stage 402.

The load circuit 35 is composed of an inductor 35A, an inductor 35B, an inductor 35C, an inductor 35D, and a capacity 35E. The inductors 35A and 35C are connected in series to each other. The respective collectors of transistors 1 and 3 are connected through the inductors 35A and 35C to a power voltage Vcc.

The inductors 35B and 35D are connected in series to each other. The respective collectors of transistors 2 and 4 are connected through the inductors 35B and inductor 35D to the power voltage Vcc.

The capacity 35E is connected between the connecting point of the inductors 35A and 35C and the connecting point of the inductors 35B and 35D. The inductors 35A and 35C cooperate together in constituting a transformer (a third transformer) the polarities of which are opposite to each other. The inductors 35B and 35D cooperate together in constituting a transformer (a fourth transformer) the polarities of which are opposite to each other.

Also, the load circuit 36 is similar in structure to the load circuit 35. The inductors 35A, 35B, 36A and 36B have the same L value. The inductors 35C, 35D, 36C, and 36D have the same L value. The capacities 35E and 36E have the same C value.

Figure 6:
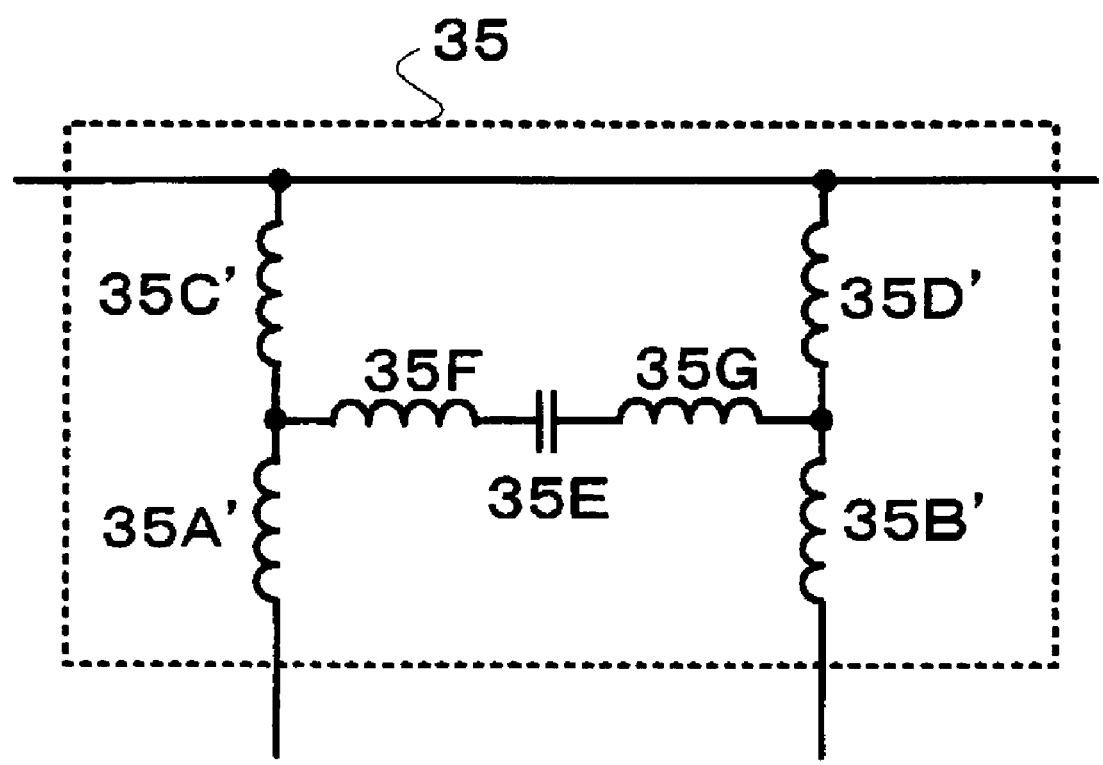
FIG. 6 is an equivalent circuit diagram of a load circuit 35 in the embodiment 4 of the invention.

FIG. 6 is a circuit diagram of the equivalent circuit of the load circuit 35. Generally, it is known that a transformer having one terminal shared in common can be treated as a T-type equivalent circuit composed of three inductances with no mutual inductance. The transformer composed of the inductors 35A and 35C can be replaced with an inductor 35A', an inductor 35C' and an inductor 35F. Also, the transformer composed of the inductors 35B and 35D can be replaced with an inductor 35B', an inductor 35D' and an inductor 35G.

Therefore, in the load circuit 35, there is employed a structure in which a resonance circuit composed of the inductors 35C', 35F and capacity 35E is connected in series to the inductor 35A'. Also, in the load circuit 35, similarly, there is also employed a structure in which a resonance circuit composed of the inductors 35D', 35G and capacity 35E is connected in series to the inductor 35B'.

As described above, in the present embodiment, since one capacity can be reduced from the load circuits employed in the embodiment 1 according to the invention and the L values of the inductors constituting the transformer can be reduced, the embodiment 4 not only can reduce the occupation area of the circuits but also can provide an equivalent characteristic to the embodiment 1. Also, preferably, the inductors and capacities used in the load circuits of the multi-band frequency divider may have a low Q factor, that is, about 1~3.

From the foregoing description, according to the multi-band frequency divider of the present embodiment, a dividable frequency band can be broadened with no need for control for varying the load circuits. Elimination of the need for control for varying the load circuits can reduce the scale of the circuit and thus can simplify the circuit. Also, the noise characteristic of the multi-band frequency divider can be improved.

By the way, in the present embodiment, description has been given above of a multi-band frequency divider using bipolar transistors. However, an FET may also be used. Also, in the present embodiment, description has been given above of a multi-band frequency divider for dividing a signal into a signal of a half frequency. However, the divided number of the frequency of a signal may also be other than two.

Embodiment 5

In the present embodiment 5, description will be given below of a fifth structure of a multi-band frequency divider which can vary and broaden a dividable frequency band with no need for control for switching the load of the frequency divider.

Figure 7:
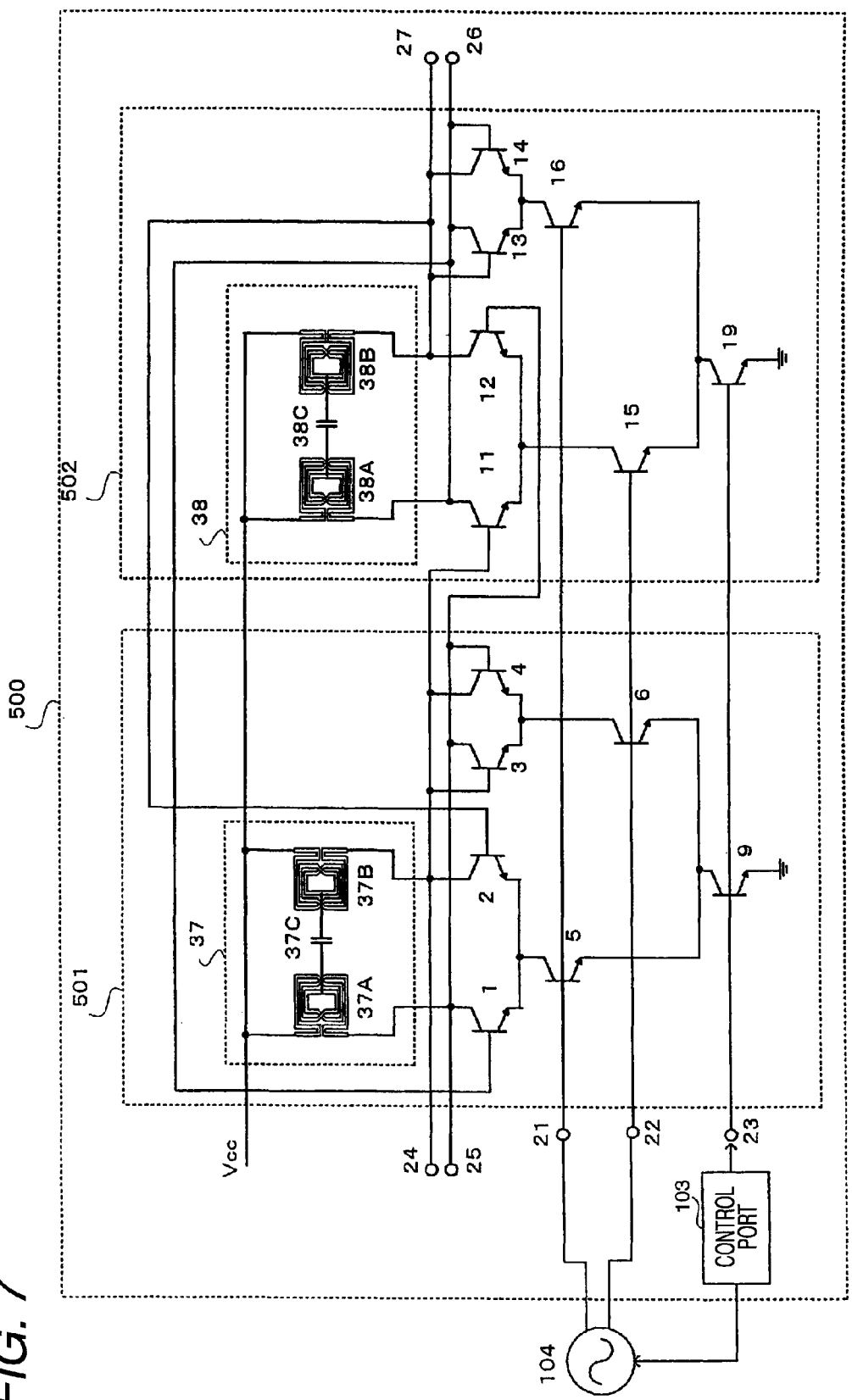
FIG. 7 is a circuit diagram of a multi-band frequency divider according to an embodiment 5 of the invention.

FIG. 7 is a circuit diagram of a multi-band frequency divider according to the embodiment 5 of the invention. In FIG. 7, the multi-band frequency divider 500 is a half frequency divider which divides a signal input therein into a signal of a half frequency and then outputs the resultant signal therefrom. In the embodiment 5, the same circuits as those described above in the embodiment 1 of the invention are given the same designations and the duplicate description thereof is omitted here. The embodiment 5 is different from the embodiment 1 in that it uses a load circuit 37 in a master stage 501 and a load circuit 38 in a slave stage 502.

The load circuit 37 is composed of an inductor 37A, an inductor 37B, and a capacity 37C. The inductors 37A and 37B are respectively a spiral inductor (a first spiral inductor). The respective collectors of transistors 1 and 3 are connected through the inductor 37A to a power voltage Vcc. The respective collectors of transistors 2 and 4 are connected through the inductor 37B to the power voltage Vcc.

The capacity 37C is connected between a point on the inductor 37A and a point on the inductor 37B (a second spiral inductor). In the load circuit 37, as an example, the midpoint of the inductor 37A and the midpoint are connected together by the capacity 37C (a fifth capacity). Also, the load circuit 38 is similar in structure to the load circuit 37. The inductors 37A, 37B, 38A and 38B have the same L value. The capacities 37C and 38C have the same C value.

As described above, in the present embodiment, since one capacity can be reduced from the load circuits employed in the embodiment 1 according to the invention and the L values of the inductors constituting the transformer can be reduced, the embodiment 5 can reduce the occupation area of the circuits and can provide an equivalent characteristic to the embodiment 1. Also, preferably, the inductors and capacities used in the load circuits of the multi-band frequency divider may have a low Q factor, that is, about 1~3.

From the foregoing description, according to the multi-band frequency divider of the present embodiment, a dividable frequency band can be broadened with no need for control for varying the load circuits. Elimination of the need for control for varying the load circuits can reduce the scale of the circuit and thus can simplify the circuit. Also, the noise characteristic of the multi-band frequency divider can be improved.

By the way, in the present embodiment, description has been given above of a multi-band frequency divider using bipolar transistors. However, an FET may also be used. Also, in the present embodiment, description has been given above of a multi-band frequency divider for dividing a signal into a signal of a half frequency. However, the divided number of the frequency of a signal may also be other than two.

Also, in the present embodiment, description has been given above of a case in which the inductors of the load circuits are composed of square-shaped spiral inductors. However, they may also be composed of octagonal-shaped or circular-shaped spiral inductors. And, in the present embodiment, description has been given above in such a manner that the capacities of the load circuit are connected to the midpoints of the spiral inductors. However, the capacities may also be connected to other positions on the spiral inductors.

Embodiment 6

In the present embodiment 6, description will be given below of a multi-band radio set which uses a multi-band frequency divider described in the above-mentioned embodiments 1 to 5.

Figure 8:
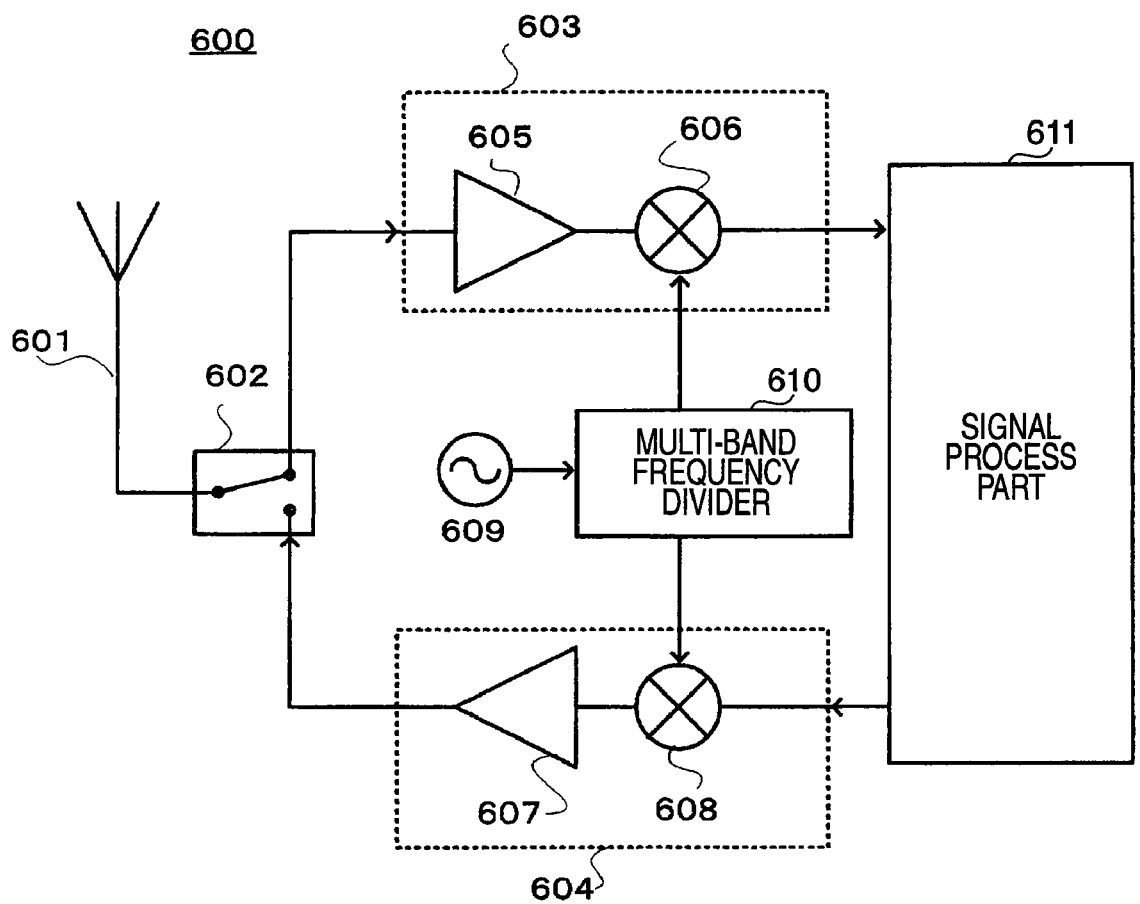
FIG. 8 is a block diagram of a multi-band radio set according to an embodiment 6 of the invention.
Figure 9:
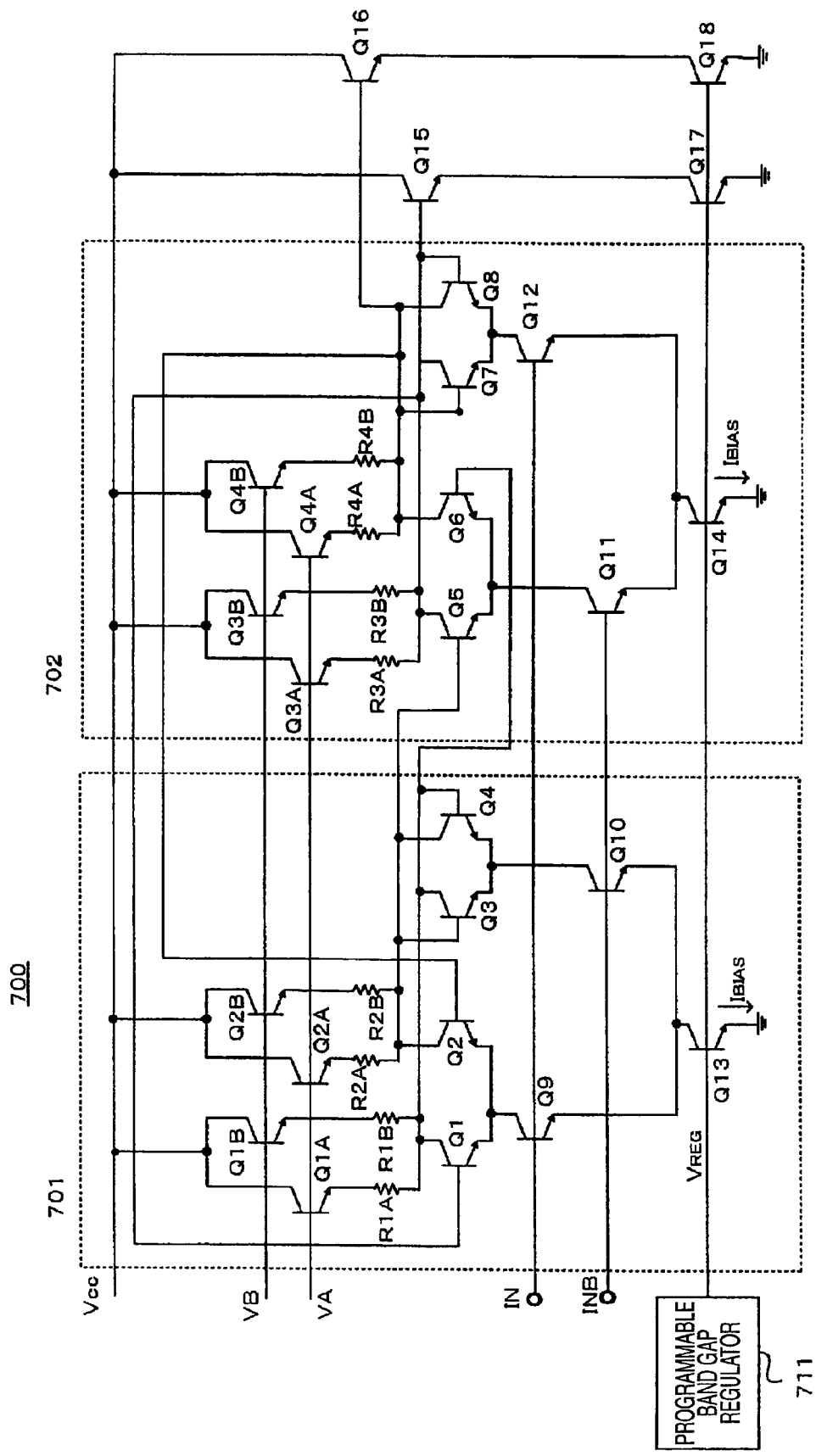
FIG. 9 is a circuit diagram of a conventional frequency divider.

FIG. 8 is a block diagram of a multi-band radio set according to the embodiment 6 of the invention. In FIG. 8, the multi-band radio set is a radio set which is capable of communication using two or more radio communication systems.

An antenna 601 is connected to a switch 602. The switch 602 is used to switch the connection of the antenna 601 to a receive part 603 or to a transmit part 604. The receive part 603 is composed of a low-noise amplifier 605 and a demodulator 606. The transmit part 604 is composed of a power amplifier 607 and a modulator 608. An oscillator 609 is connected to a multi-band frequency divider 610. The oscillator 609 includes, for example, two or more LC resonance circuits and is able to output a signal to a wide frequency band. The multi-band frequency divider 610 inputs a local oscillation signal to the demodulator 606 and modulator 608. A signal process part 611 is connected to the receive part 603 and transmit part 604.

Now, description will be given below of the receiving operation of the multi-band radio set 600. The switch 602 is connected to the receive part 603. A high frequency receive signal received by the antenna 601 is amplified by the low-noise amplifier 605 and is then input to the demodulator 606. The demodulator 606 mixes together the high frequency receive signal and local oscillation signal and then inputs a base band receive signal to the signal process part 611.

Next, description will be given below of the transmitting operation of the multi-band radio set 600. The switch 602 is connected to the transmit part 604. The signal process part 611 inputs a base band transmit signal to the modulator 608. The modulator 608 mixes together the base band transmit signal and local oscillation signal and then inputs the high frequency transmit signal to the power amplifier 607. The high frequency transmit signal is amplified by the power amplifier 607 and is then radiated from the antenna 601. The multi-band frequency divider 610 can divide the signal of the oscillator 609 into a wide frequency band and also can supply the divided signal to the receive part 603 and transmit part 604.

Thanks to the above structure, according to the multi-band radio set of the present embodiment, since the multi-band frequency divider divides the output of the oscillator into a wide frequency band, the radio part of the radio set can be simplified as well as can be reduced in size and cost. Also, because the noise characteristic of the radio set can be improved, the receiving characteristic of the radio set can also be improved.

By the way, in the present embodiment, description has been given above of an example in which the frequency divider includes the load circuits. However, the load circuits may only be connected to the frequency divider and it is not always necessary to incorporate the load circuits in the frequency divider. Also, in the present embodiment, the transmission and reception are switched by using a switch. However, there may also be used a duplexer. Further, in the present embodiment, there is employed the structure in which the radio frequencies are converted directly to the base band frequencies. However, there may also be employed other structures than this structure.

Although description has been given heretofore in detail of the invention with reference to the specific embodiments thereof, it is obvious to persons skilled in the art that various changes and modifications are possible without departing from the spirit and scope of the invention.

The present patent application is based on the Japanese patent application (patent application No. 2005-256781) filed on Sep. 5, 2005 and the Japanese patent application (patent application No. 2006-220002) filed on Aug. 11, 2006 and thus the contents thereof are incorporated herein for reference.

INDUSTRIAL APPLICABILITY

The present invention provides an effect that it can vary and broaden a dividable frequency band with no need for control for varying a load circuit. Therefore, the invention can apply effectively to an electronic circuit and a frequency divider for varying and broadening a dividable input frequency band, as well as to a radio set capable of using two or more radio communication systems by using such electronic circuit and frequency divider.

The invention claimed is:

1. An electronic circuit to be connected to a master-slave mode D flip flop constituting a frequency divider, comprising:
   a first circuit element, in which a free run frequency when the first circuit element is used as a load circuit of the D flip flop is provided as a first free run frequency, wherein the first circuit element is composed of a first inductor; and
   a second circuit element, in which the free run frequency when the second circuit element is used as a load circuit of the D flip flop is provided as a second free run frequency different from the first free run frequency, wherein the second circuit element is composed of a first LC parallel resonance circuit;
   wherein the first and second circuit elements are connected in series to each other;
   wherein the electronic circuit further comprises:
      a master stage including:
         a first load circuit composed of the first inductor and the first LC parallel resonance circuit connected in series to each other; and
         a second load circuit composed of a second inductor and a second LC parallel resonance circuit connected in series to each other; and
      a slave stage including:
         a third load circuit composed of a third inductor and a third LC parallel resonance circuit connected in series to each other; and
         a fourth load circuit composed of a fourth inductor and a fourth LC parallel resonance circuit connected in series to each other.

2. The electronic circuit as set forth in claim 1, further including:
   a first capacity using in common a capacity of the first LC parallel resonance circuit and a capacity of the second LC parallel resonance circuit by virtual grounding; and
   a second capacity using in common a capacity of the third LC parallel resonance circuit and a capacity of the fourth LC parallel resonance circuit by virtual grounding.

3. The electronic circuit as set forth in claim 2, wherein:
   an inductor of the first LC parallel resonance circuit and an inductor of the second LC parallel resonance circuit cooperate together in forming a transformer; and
   an inductor of the third LC parallel resonance circuit and an inductor of the fourth LC parallel resonance circuit cooperate together in forming a transformer.

4. The electronic circuit as set forth in claim 2, wherein:
   the first inductor and an inductor of the first LC parallel resonance circuit cooperate together in forming a transformer;
   the second inductor and an inductor of the second LC parallel resonance circuit cooperate together in forming a transformer;
   the third inductor and an inductor of the third LC parallel resonance circuit cooperate together in forming a transformer; and
   the fourth inductor and an inductor of the fourth LC parallel resonance circuit cooperate together in forming a transformer.

5. The electronic circuit as set forth in claim 2, wherein:
   a first spiral inductor is used to constitute the first inductor and an inductor of the first LC parallel resonance circuit;
   a second spiral inductor is used constitute the second inductor and an inductor of the second LC parallel resonance circuit, the first capacity connects together the first and second spiral inductors;
   a third spiral inductor is used to constitute the third inductor and an inductor of the third LC parallel resonance circuit;
   a fourth spiral inductor is used to constitute the fourth inductor and an inductor of the fourth LC parallel resonance circuit, the second capacity connects together the third and fourth spiral inductors.

6. The electronic circuit as set forth in claim 1, wherein the first free run frequency is higher than the second free run frequency.

7. A frequency divider, comprising the electronic circuit as set forth in claim 1.

8. The frequency divider as set forth in claim 7, further including a control part for varying a bias current of the master-slave mode D flip flop.

9. A radio set, incorporating therein the frequency divider as set forth in claim 8.

* * * * *